US009077264B2

(12) United States Patent
Ohsawa et al.

(10) Patent No.: US 9,077,264 B2
(45) Date of Patent: Jul. 7, 2015

(54) CHARGED PARTICLE BEAM APPARATUS AND ELECTROSTATIC CHUCK APPARATUS (75) Inventors: Tetsuji Ohsawa, Tokyo (JP); Naoya Ishigaki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/118,892

(22) PCT Filed: May 18, 2012

(86) PCT No.: PCT/JP2012/062835
§ 371 (c)(1),
(2), (4) Date: Nov. 19, 2013

(87) PCT Pub. No.: WO2012/161128
PCT Pub. Date: Nov. 29, 2012

(65) Prior Publication Data
US 2014/0091232 A1 Apr. 3, 2014

(30) Foreign Application Priority Data
May 20, 2011 (JP) ................................. 2011-113598

(51) Int. Cl.
*H01L 21/683* (2006.01)
*H02N 13/00* (2006.01)
*H01J 37/20* (2006.01)
*H01J 37/28* (2006.01)

(52) U.S. Cl.
CPC ............ *H02N 13/00* (2013.01); *H01L 21/6831* (2013.01); *H01J 37/20* (2013.01); *H01J 37/28* (2013.01); *H01J 2237/2007* (2013.01); *H01J 2237/248* (2013.01)

(58) Field of Classification Search
CPC . H01L 21/6831; H01L 21/6833; H02N 13/00
USPC .................................................. 250/307, 310
See application file for complete search history.

(56) References Cited

U.S. PATENT DOCUMENTS

2001/0055189 A1* 12/2001 Hagi ............................. 361/234
2006/0056131 A1 3/2006 Tanimoto et al.
2007/0181808 A1* 8/2007 Murakoshi et al. ........... 250/310

(Continued)

FOREIGN PATENT DOCUMENTS

JP 10-074808 A 3/1998
JP 11-330220 A 11/1999

(Continued)

*Primary Examiner* — Robert Kim
*Assistant Examiner* — Eliza Osenbaugh-Stewar
(74) *Attorney, Agent, or Firm* — Miles & Stockbridge P.C.

(57) ABSTRACT

To improve an apparatus reliability by applying a voltage suitable to a situation, a charged-particle-beam apparatus 1 of the present invention includes: a sample stage 25; an electrostatic chuck 30; and an electrostatic-chuck controlling unit 13, and generates an image of a sample 24 by irradiating the sample 24 held on the sample stage 25 by the electrostatic chuck 30 with an electron beam 16. The electrostatic-chuck controlling unit 13, when the electrostatic chuck 30 holds the sample 24, applies a preset initial voltage to a chuck electrode of the electrostatic chuck 30; determines whether or not the sample 24 is normally clamped to the electrostatic chuck 30; and increases the voltage applied to the chuck electrode until determining that the sample 24 is clamped normally to the electrostatic chuck 30 if determining that the sample 24 is not clamped normally to the electrostatic chuck 30.

2 Claims, 8 Drawing Sheets

(56) References Cited

U.S. PATENT DOCUMENTS

2011/0199093 A1* 8/2011 Fujisawa .................. 324/537
2011/0201139 A1* 8/2011 Ishida et al. .................. 438/17

FOREIGN PATENT DOCUMENTS

JP 2006-108643 A 4/2006
WO WO-2010-40649 * 12/2010 ............. H01J 37/20

* cited by examiner

CHARGED PARTICLE BEAM APPARATUS AND ELECTROSTATIC CHUCK APPARATUS

BACKGROUND OF THE INVENTION

1. Field of the Invention

The present invention relates to a sample holding control technology in an electrostatic chuck of a charged-particle-beam apparatus.

2. Description of Related Art

An apparatus for processing a semiconductor wafer, an apparatus for inspecting a circuit pattern on a semiconductor wafer, or the like using a charged-particle beam has a sample holding function by an electrostatic chuck method using an electrostatic-clamping force in order to hold the semiconductor wafer.

An example of such an apparatus is an electron-beam-based length measurement apparatus. This apparatus is intended to measure a width or a position of a circuit pattern fabricated on a semiconductor wafer. The electrostatic chuck method includes the Coulomb method and the Johnsen-Rahbek method. In the electron-beam-based length measurement apparatus, the Coulomb method in which no current flows in the semiconductor wafer is adopted since the probe current is very small.

The Coulomb method needs a larger applied voltage compared to the Johnsen-Rahbek method, because a resistivity of a dielectric is very large. This causes problems described later.

As for the method for determining whether or not the semiconductor wafer (sometimes called "wafer" in this application) is normally clamped by the electrostatic chuck, there is proposed an method which sets as a reference value, the current flowing through the electrostatic chuck circuit when the wafer is clamped normally, and determines that the wafer is not correctly disposed (abnormal) when the current is smaller than the reference value (see Patent Document 1, for example).

RELATED ART DOCUMENT

Patent Document

1. Japanese Laid Open Patent Application No. H11-330220

SUMMARY OF THE INVENTION

Problems to be Solved by the Invention

The electrostatic chuck may cause the problem that clamping force remains even after the power is turned of (a residual clamping force), according to a relationship between the applied voltage and time. This is a state in which an attraction force unintentionally remains because the electric charge inducted on the wafer surface or the like is not released. As the voltage applied to the electrostatic chuck increases, the residual clamping force tends to be larger. Such a state causes a situation that needs to make the inner of the sample room opened to the atmosphere to manually pull out the sample and leads to a problem to increase an equipment downtime of the apparatus.

The present invention has been made in view of such a problem, and is intended to improve the reliability of the apparatus by setting an applied voltage in accordance with a situation.

Solution to the Problems

In order to solve the above problems, the charged-particle-beam apparatus according to the present invention, which generates an image of a sample by irradiating the sample held on the sample stage by the electrostatic chuck with an electron beam, includes an electrostatic-chuck controlling unit that, when holding the sample, applies a predetermined initial voltage to a chuck electrode of the electrostatic chuck, at the same time determines whether or not the sample is normally clamped to the electrostatic chuck or not, and increases the voltage applied to the chuck electrode until that the sample is determined to be clamped normally to the electrostatic chuck if it is determined that the sample is not normally clamped to the electrostatic chuck.

Other means for solving the problems is described in the embodiment appropriately as necessary.

Effects of the Invention

According to the present invention, it is possible to improve the reliability of the apparatus by setting an applied voltage in accordance with the situation.

BRIEF DESCRIPTION OF THE DRAWINGS

FIGS. 3A and 3B are diagrams describing a residual clamping force.

FIGS. 7A and 7B are diagrams relating to measurement of the wafer edge portion.

DETAILED DESCRIPTION OF THE INVENTION

Embodiments for Implementing the Invention

First Embodiment

Hereinafter, the first embodiment of the present invention is described with reference to FIG. 1 to FIG. 6. For parts common in each diagram, the same reference numerals are assigned and the duplicate description is omitted.

Configuration of the Charged-Particle-Beam Apparatus 1

Figure 1:
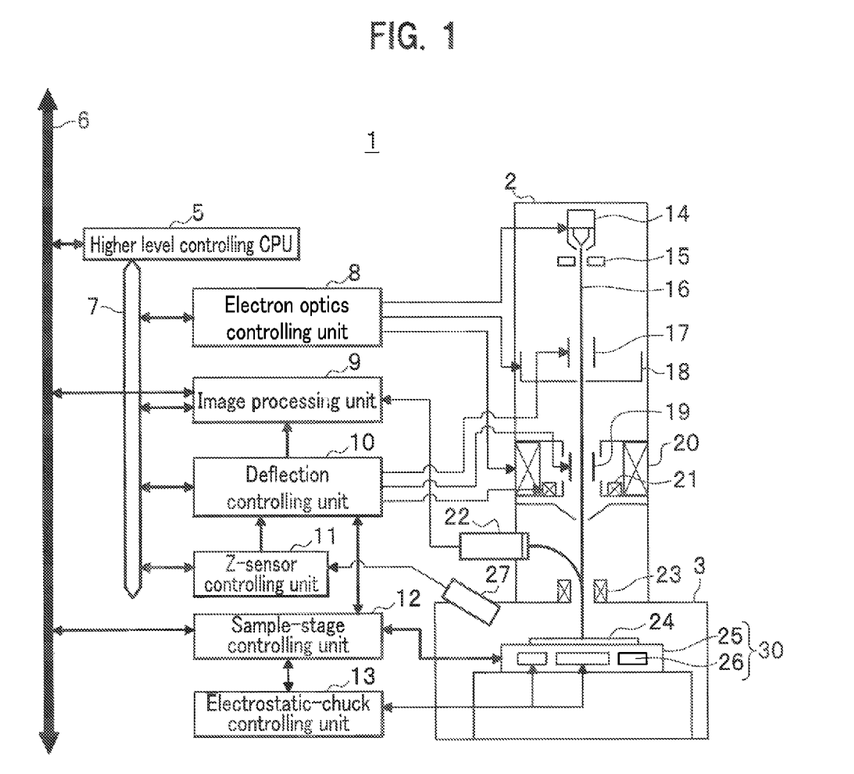
FIG. 1 is a diagram showing a configuration of a charged-particle-beam apparatus according to an embodiment.

FIG. 1 is a diagram showing a structure of the charged-particle-beam apparatus 1 according to an exemplary embodiment.

As shown in FIG. 1, the charged-particle-beam apparatus 1 is provided with an electron optics column 2, a sample chamber 3, and a control system.

First, an observation operation of the charged-particle-beam apparatus 1 is described.

In the sample chamber 3, a wafer (sample) 24 is held on a sample stage 25 by an electrostatic chuck 30 having a chuck electrode 26. A Z-sensor 27 detects a height of the wafer 24 and outputs the height information to a Z-sensor controlling unit 11.

A primary electron beam 16 is emitted from an electron gun 14 in the electron optics column 2, being controlled by an extracting electrode 15. The primary electron beam 16 is focused by a focus coil 20 or a position-tuning focus coil 21, and scans the wafer 24 while being deflected by a deflector 19. If the primary electron beam 16 is needed to be blanked, a blanking deflector 17 deflects the primary electron beam 16 to prevent the primary electron beam 16 from passing through a diaphragm 18.

The electron gun 14, diaphragm 18, and focus coil 20 are controlled by an electron-optics controlling unit 8.

The blanking deflector 17, deflector 19, and position-tuning focus coil 21 are controlled by a deflection controlling unit 10.

When the primary electron beam 16 is irradiated to the wafer 24, a reflected electron and a secondary electron are generated, accelerated by the ExB deflector 23, and detected by the secondary electron detector 22. The detection signal of the reflected electrons and secondary electrons detected by the second electron detector 22 is input to the image processing unit 9. The image processing unit 9 generates image data based on control information. The generated image data is displayed as an image on a display device not shown in a figure through an Ethernet (Registered Trademark) 6.

The electron-optics controlling unit 8, image processing unit 9, deflection controlling unit 10, and a Z-sensor controlling unit 11 are controlled by a higher level controlling CPU (Central Processing Unit) 5 through a VME Bus (VERSA Module Eurocard Bus) 7.

A sample-stage controlling unit 12 controls a position of the sample stage 25. When the plane perpendicular to the vertical axis referred to as X-Y plane, the sample stage 25 is movable in the X and Y directions in the X-Y plane, and the sample-stage controlling unit 12 measures X and Y coordinates of the sample stage 25 and moves the sample stage 25 on the basis of predetermined information.

The electrostatic-chuck controlling unit 13 applies a voltage to the chuck electrode 26 of the electrostatic chuck 30, and determines the clamped state of the wafer 24. The electrostatic-chuck controlling unit 13 can also change the applied voltage. Next, the electrostatic-chuck controlling unit 13 is described in detail.

Configuration of Electrostatic-Chuck Controlling Unit 13

Figure 2:
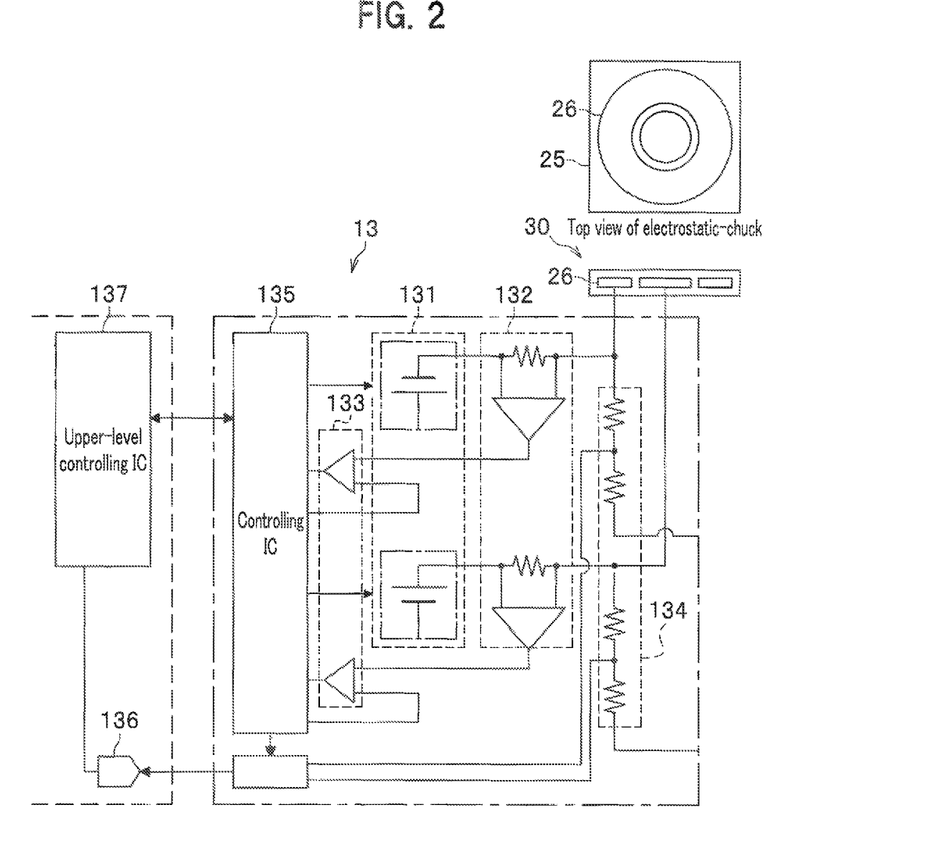
FIG. 2 is a diagram showing a configuration of an electro-static-chuck controlling unit in the charged-particle-beam apparatus according to the embodiment.

FIG. 2 is a diagram showing a configuration of the electrostatic-chuck controlling unit 13.

As shown in FIG. 2, the electrostatic-chuck controlling unit 13 is provided with a voltage applying unit 131, a current detection unit 132, and a clamping checking unit 133, an output-voltage dividing and monitoring unit 134, and a controlling IC (Integrated Circuit) 135.

The chuck electrode 26 is embedded in the sample stage 25 and constitutes the electrostatic chuck 30 of a concentric dipole type. The voltage applying unit 131 applies a voltage to the chuck electrode 26 of the electrostatic chuck 30. The electric potential of the portion indicated by a one-dot chain line is, for example, a potential VR. The voltage applying unit 131 is formed on the portion where the potential is the VR. Therefore, the voltage in the output portion of the voltage applying unit 131 is higher than GND (ground) of the charged particle beam apparatus 1 by the added potential VR.

The voltage applying unit 131 is provided with an output voltage altering function which is not shown in any of figures and the voltage applied to the chuck electrode 26 is controlled by the upper level controlling IC 137 through the controlling IC 135. That is, the voltage applied to the chuck electrode 26 can be set to a target voltage value, and turned on/off, from the outside.

In order to avoid affecting the primary electron beam 16 that is irradiated to the wafer 24 (not shown in FIG. 2), it is enough to make a slight difference between voltages applied to +/− electrodes of the chuck electrode 26 based on the area ratio between the +/− electrodes.

Here is explained how to determine whether or not the wafer 24 is clamped normally to the electrostatic chuck 30.

When the voltage applying unit 131 applies a voltage to the chuck electrode 26 with the wafer 24 being mounted on the electrostatic chuck 30, a dielectric polarization occurs on the surface of the electrostatic chuck 30 and the back surface of the wafer 24. Thereby, the capacitor is formed between the wafer 24 and the positive and negative, electrodes of the chuck electrode 26. At this time, between the wafer 24 and the positive and negative electrodes of the chuck electrode 26 is generated the transient current proportional to a capacity of the capacitor. If the clamped state of the wafer 24 is normal, the capacity is larger than that of the abnormal case. Therefore, comparing the peak magnitude of the measured transient current with a predetermined threshold enables determining whether or not the wafer 24 is normally clamped to the electrostatic chuck 30 or not.

Accordingly, the controlling IC 135 is able to recognize the clamped state of the wafer 24 by detection of the transient current generated from the chuck electrode 26 by the current detection unit 132 and by comparison of the amount of the transient current with a predetermined threshold by the clamping checking unit 133.

The output-voltage dividing/monitoring unit 134 is a unit for monitoring an actual applied voltage to the chuck electrode 26 (hereinafter, called "chuck voltage" as necessary). The chuck voltage is recognized by the upper-level controlling IC 137 through an ADC (Analog to Digital Converter) 136.

As described above, the electrostatic-chuck controlling unit 13 is able to change the voltage applied to the chuck electrode 26 depending on the situation of the wafer 24.

Next, a description is given of tolerance on the voltage applied to the chuck electrode 26.

Figure 3A:
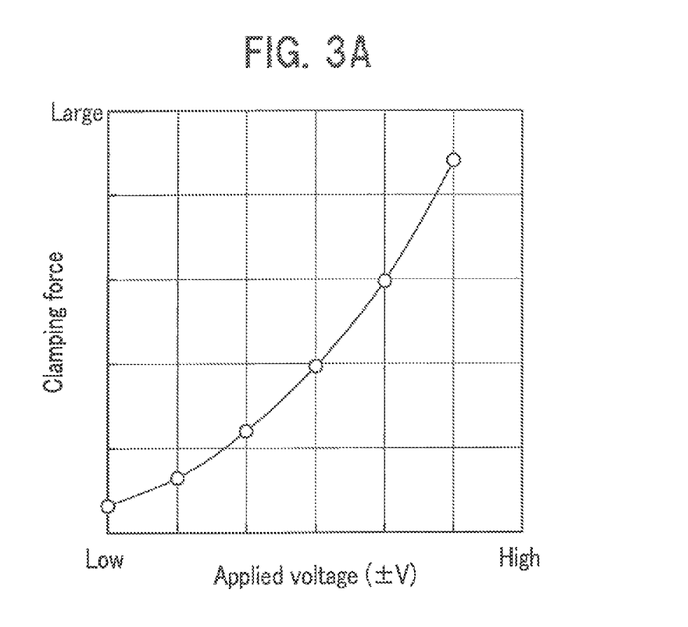
FIG. 3A is a graph showing a relationship between a magnitude of a voltage applied to a chuck electrode and an clamping force of a wafer.

FIG. 3A is a graph showing a relationship between the magnitude of the voltage applied to the chuck electrode 26 and the clamping force of the wafer 24. As shown in this graph, as the applied voltage of the chuck electrode 26 is higher, the clamping force of the wafer 24 is larger. Since too large clamping force causes a problem of generation of abnormal substances due to friction, the voltage applied to the chuck electrode 26 should not be higher than necessary.

Figure 3B:
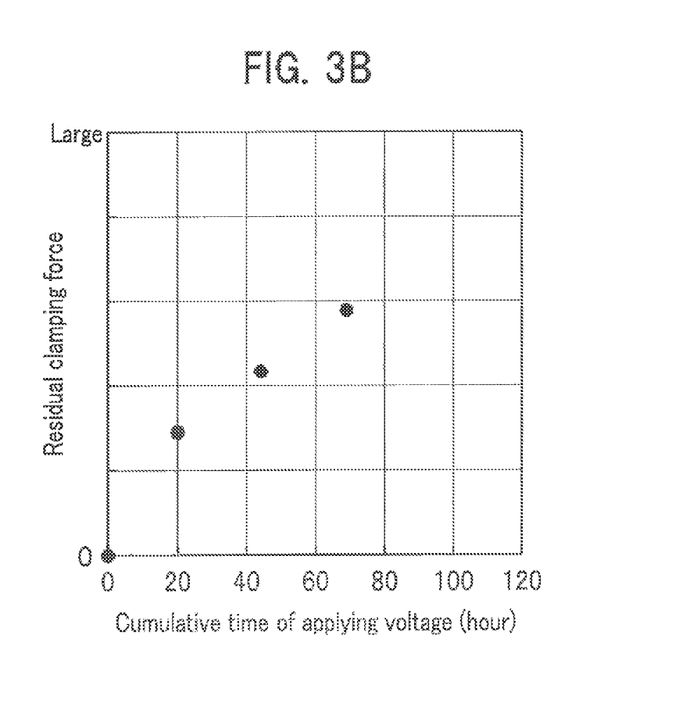
FIG. 3B is a graph showing a relationship between a cumulative time of applying a voltage and the residual clamping force.

FIG. 3B is a graph showing a relationship between a cumulative time of applying a voltage and the residual clamping force when applying the maximum voltage to the chuck electrode 26. As shown in this graph, there is a tendency that the longer the voltage is applied to the chuck electrode 26, the larger the residual clamping force is.

In addition, it is found that as the clamping force is larger (as the applied voltage is higher), the residual clamping force is larger. Therefore, minimizing the effects of the residual clamping force requires to lower the applied voltage and to shorten the voltage application time.

Next, requirements for a voltage applied to the chuck electrode 26 are described.

Figure 4A:
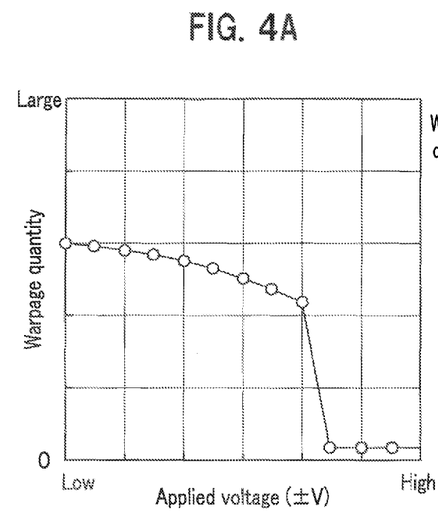
FIG. 4A is a graph showing a relationship between a magnitude of a chuck voltage and warpage quantity of a warped wafer.
Figure 4B:
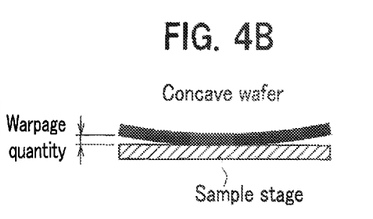
FIGS. 4B and 4C are diagrams explaining "warpage quantity" of the vertical line in FIG. 4A.
Figure 4C:
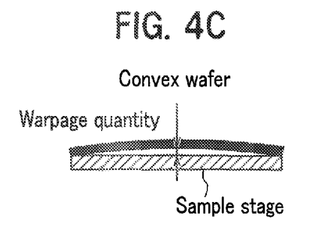

FIG. 4A is a graph showing a relationship between a magnitude of a chuck voltage and warpage quantity of a warped wafer. FIGS. 4B and 4C are diagrams explaining "warpage quantity" of the vertical line in FIG. 4A. As shown in the graph, in order to flatten the warped wafer, it is necessary to apply a somewhat higher voltage.

In the observation of the semiconductor wafer, in order to achieve highly accurate measurement, the wafer 24 is required to be flat. The wafer without warping (hereinafter, "flat wafer") does not need to be applied a higher voltage as is applied to the warped wafer, and is successfully clamped to the electrostatic chuck 30 at a relatively lower voltage.

In order to cope with such various situations of the wafer 24, the electrostatic-chuck controlling unit 13 regulates a voltage applied to the chuck electrode 26, based on the waveform of the transient current generated when the wafer 24 is clamped to the electrostatic chuck 30.

Figure 5:
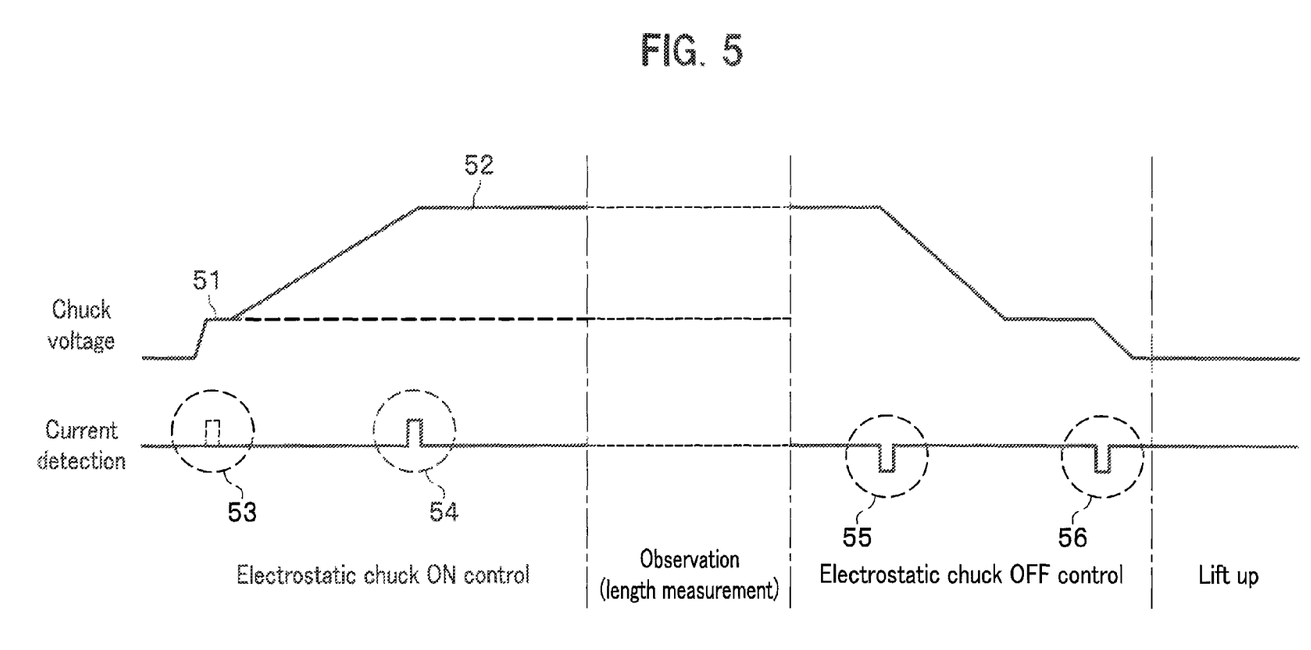
FIG. 5 is a diagram showing a variation in a time axis of the chuck since the wafer is placed on a sample stage, through an observing operation, until the wafer is desorbed from the electrostatic chuck.

FIG. 5 shows a variation over time of the chuck voltage, from when the wafer 24 is placed on the sample stage 25, through the operations in which the wafer 24 is clamped on the electrostatic chuck 30 (the electrostatic chuck ON control); the sample stage 25 moves; an observing operation (length measurement) is performed; and the wafer 24 is desorbed from the electrostatic chuck 30 (the electrostatic chuck OFF control), until when the wafer 24 goes away from the sample stage 25, "Current detection" schematically shows the transient current 53, 54 indicating that the wafer is normally clamped to the electrostatic chuck.

If the transient current 53 indicating the normal clamping of the wafer 24 is detected when the chuck voltage becomes the initial voltage 51, the chuck voltage is kept at the initial voltage 51 (the broken line). And observing operation (length measurement) is performed, while the initial voltage 51 is being kept.

On the other hand, if the transient current 53 indicating the normal clamping of the wafer 24 is not detected when the chuck voltage becomes the initial voltage 51, the chuck voltage is gradually increased (the solid line). Then, if the transient current 54 indicating the normal clamping of the wafer 24 is detected when the chuck voltage becomes an applied voltage 52, the chuck voltage is kept at the applied voltage 52 (the solid line). And observing operation length measurement) is performed, while the applied voltage 52 is being kept.

When the wafer 24 becomes loose from the electrostatic chuck 30, the negative transient current 55 and 56 is detected. In addition, in this example, the voltage applied to the chuck voltage is stopped at a lower voltage to be decreased and then turned off, instead of being turned off immediately from the higher voltage.

This has an effect of reducing the impact of the residual clamping force.

Operation of Charged-Particle-Beam Apparatus

Next, an operation of the charged-particle-beam apparatus 1 is described with reference to FIGS. 5 and 6 (as for the configuration, see FIGS. 1 and 2 as necessary).

Figure 6:
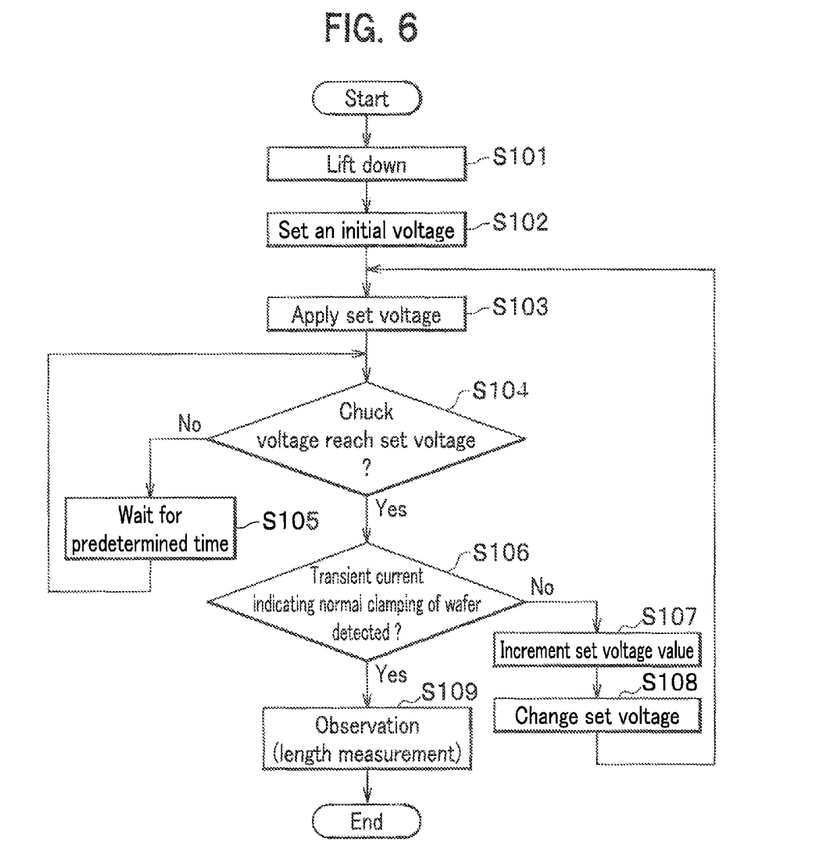
FIG. 6 is a flow chart showing an operation of a charged-particle-beam apparatus according to a first embodiment.

FIG. 6 is a flowchart showing the operation of the charged-particle-beam apparatus 1 according to the first embodiment.

As shown in the flow chart of FIG. 6, in step S101, the charged-particle-beam apparatus 1 brings down a lift for mounting the wafer 24 on the sample stage 25.

In step S102, the electrostatic-chuck controlling unit 13 sets the initial voltage 51 as a set voltage.

In step S103, the electrostatic-chuck controlling unit 13 applies the set voltage to the chuck electrode 26.

In step S104, the electrostatic-chuck controlling unit 13 determines whether or not the chuck voltage reaches the set voltage.

If the electrostatic-chuck controlling unit 13 determines that the chuck voltage does not reach the set voltage ("No" in Step S104), the electrostatic-chuck controlling unit 13 waits for a predetermined time in step S105, and once again determines whether or not the chuck voltage reaches the set voltage in step S104.

On the other hand, if the electrostatic-chuck controlling unit 13 determines that the chuck voltage reaches the set voltage ("Yes" in step S104), the electrostatic-chuck controlling unit 13 determines whether or not the transient current, which indicates that the wafer 24 is normally clamped, is detected in step S106. That is, the wafer 24 is determined whether or not it is normally clamped to the electrostatic chuck.

For example, as shown in FIG. 5, the electrostatic-chuck controlling unit 13 determines whether or not the transient current 53 indicating successful clamping of the wafer 24 is detected.

If the electrostatic-chuck controlling unit 13 determines that the transient current indicating successful clamping of the wafer 24 is detected ("Yes" in step S106), the sample-stage controlling unit 12 moves the sample stage 25 in step S109.

For example, as shown in FIG. 5, when detecting the transient current 53 indicating the wafer 24 being clamped, the electrostatic-chuck controlling unit 13 keeps the chuck voltage at the initial voltage 51 (dashed line). And, the sample-stage controlling unit 12 moves the sample stage 25 and the charged-particle-beam apparatus 1 performs the observing operation (length measurement).

On the other hand, if the electrostatic-chuck controlling unit 13 determines that no transient current indicating normal clamping of the wafer 24 is detected ("No" in step S106), the electrostatic-chuck controlling unit 13 increments the set voltage value by the preset voltage resolution value in step S107.

In step S108, the electrostatic-chuck controlling unit 13 changes the set voltage to the addition result, and then the process returns to step S103. That is, the electrostatic-chuck controlling unit 13 gradually increases the voltage applied to the chuck electrode 26 until detecting the transient current indicating that the wafer 24 is properly clamped (until the wafer 24 is clamped successfully to the electrostatic chuck).

For example, as shown in FIG. 5, when not being able to detect the transient current 53 indicating that the wafer 24 is normally clamped, the electrostatic-chuck controlling unit 13 gradually increases the chuck voltage (solid line). When the chuck voltage becomes the applied voltage 52 and the electrostatic-chuck controlling unit 13 detects the transient current 54 indicating the normal clamping of the wafer 24, the electrostatic-chuck controlling unit 13 keeps the chuck voltage at the applied voltage 52 (solid line). Then, the sample-stage controlling unit 12 moves the sample stage 25, and the charged-particle-beam apparatus 1 performs the observing operation (length measurement).

The above-mentioned operation avoids the applied voltage from always being a higher voltage, by setting the initial voltage at a lower voltage and by keeping the voltage applied at the time when the transient current indicating the normal clamping of the wafer 24 is detected (when the wafer 24 is normally clamped to the electrostatic chuck).

Therefore, the time until the applied voltage stabilizes is shortened, and the throughput of the apparatus is increased.

In addition, the applied voltage can be controlled according to a state of the sample (the wafer 24).

Furthermore, it is possible to reduce of the risk of an electric discharge in a transfer chamber, the occurrence frequency of the residual clamping, and possibility of generation of an abnormal substances by friction, as well as power consumption.

Second Embodiment

Next, a second embodiment of the present invention is described with reference to FIGS. 7A, 7B, and 8. Parts common to the first exemplary embodiment are assigned the same reference characters and the duplicate descriptions are omitted.

Figure 7A:
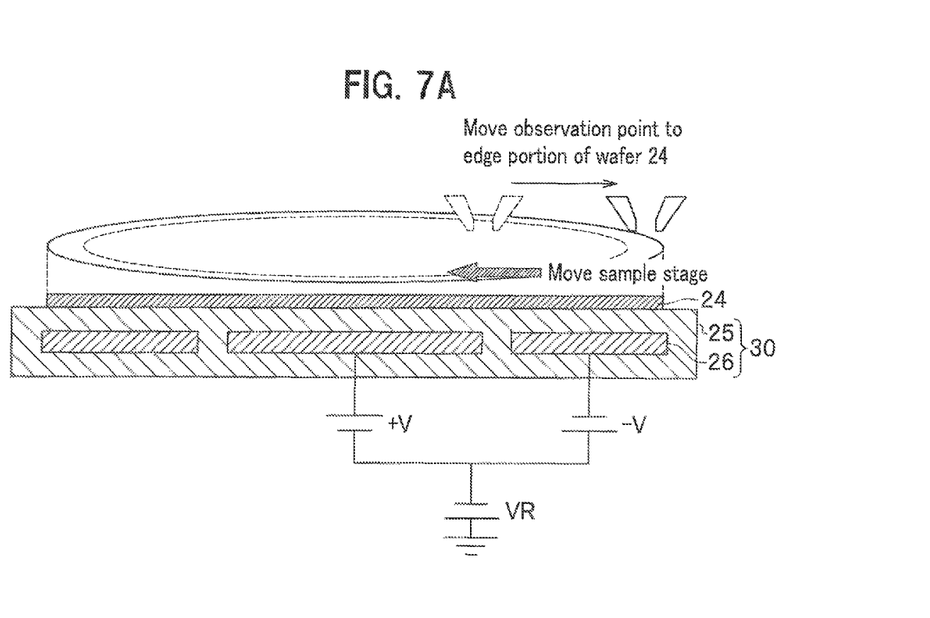
FIG. 7A is a diagram showing how an observation point is moved to the edge portion of the wafer.
Figure 7B:
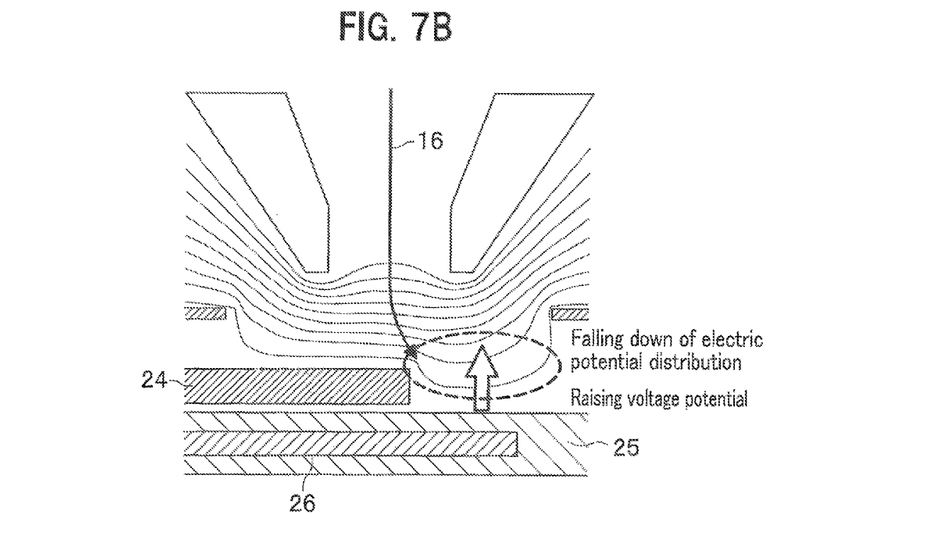
FIG. 7B is a diagram showing a distribution of an electric potential in the vicinity of the edge portion of the wafer.

FIG. 7A is a diagram showing how an edge portion of the wafer 24 becomes an observed point, and FIG. 7B is a diagram showing an electric potential distribution near the edge portion of the wafer 24.

As shown in FIG. 7A, in the observing operation, the edge portion of the wafer 24 may become an observation target when the sample stage 25 moves. At this time, as shown in FIG. 7B, the electric potential distribution outside of the wafer 24 falls down, which may affect the primary electron beam 16 to cause deviation in a visual field of an image of the wafer 24, and also lead to narrowing the visual field of the image.

In order to solve such a problem, when the sample stage 25 moves to the position where the edge portion of the wafer 24 becomes the observation target, the voltage applied to the chuck electrode 26 is made a higher voltage. Note that X and Y coordinates of the sample stage 25 where the edge portion of the wafer 24 becomes the observation target can be set in advance.

This makes it possible to raise the electric potential of the outside around the wafer 24 and to prevent the visual field from being deviated.

Operation of the Charged-Particle-Beam Apparatus 1 (2)

Figure 8:
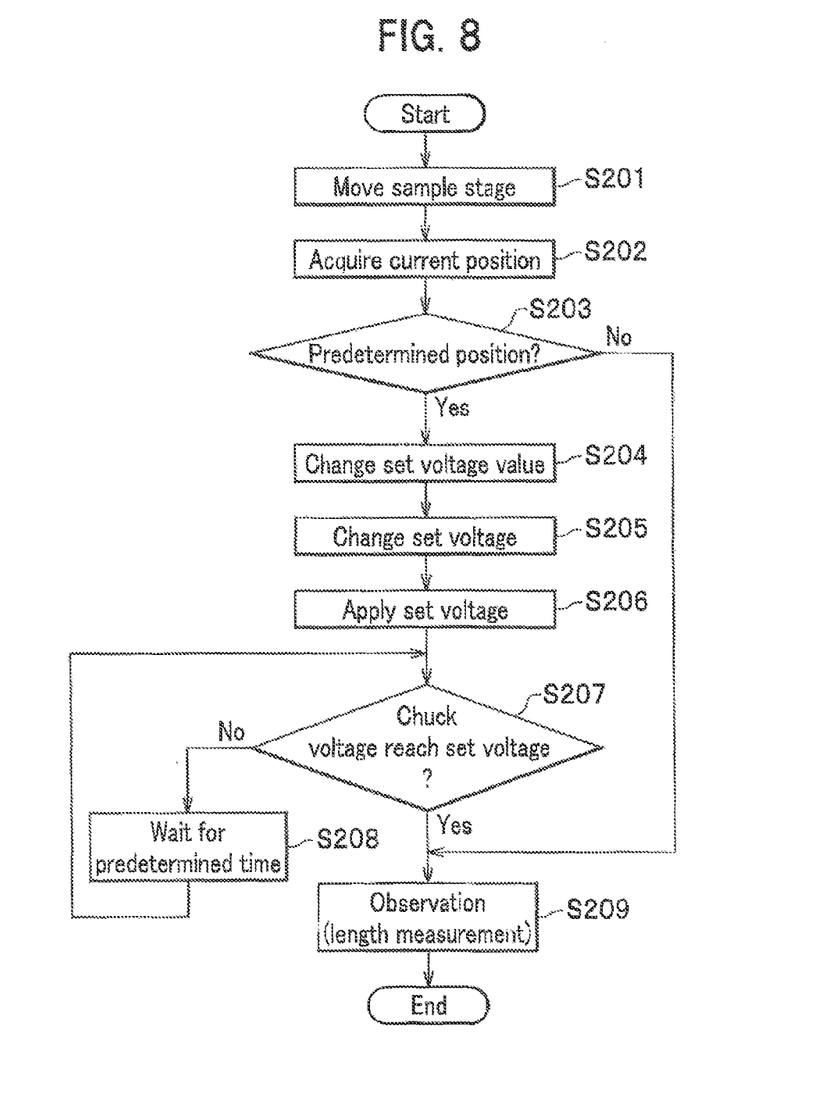
FIG. 8 is a flow chart showing an operation of the charged-particle-beam apparatus according to a second embodiment.

Next is described the operation of the charged-particle-beam apparatus 1 in the second embodiment with reference to FIGS. 7A, 7B, and 8 (refer to FIGS. 1 and 2 for the configuration as necessary). This process is performed each time the sample stage 25 is moved.

As shown in the flowchart of FIG. 8, the sample-stage controlling unit 12 moves the sample stage 25, in step S201.

In step S202, the sample-stage controlling unit 12 acquires the current position of the sample stage 25.

In step S203, the sample-stage controlling unit 12 determines whether or not the current position of the sample stage 25 is a predetermined position. Here, the predetermined position is a position of the sample stage where the edge portion of the wafer 24 is the observation target.

If the charged particle beam apparatus determines that the current position of the sample stage 25 is not the predetermined position ("No" in step S203), the charged-particle-beam apparatus 1 performs the observing operation (length measurement) without changing the condition, in step S209.

On the other hand, if the charged particle beam apparatus determines that the current position of the sample stage 25 is the predetermined position ("Yes" in step S203), the electrostatic-chuck controlling unit 13 updates the set voltage value in step S204. Specifically, the electrostatic-chuck controlling unit 13 makes the set voltage a higher voltage.

In step S205, the electrostatic-chuck controlling unit 13 changes the set voltage to the updated voltage value.

In step S206, the electrostatic-chuck controlling unit 13 applies the set voltage to the chuck electrode 26.

In step S207, the electrostatic-chuck controlling unit 13 determines whether or not the chuck voltage reaches the set voltage.

If the electrostatic-chuck controlling unit 13 determines that the chuck voltage does not reach the set voltage ("No" in step S207), the electrostatic-chuck controlling unit 13 waits for a predetermined time in step S208 and determines whether or not the chuck voltage reaches the set voltage once again in step S207.

On the other hand, if the electrostatic-chuck controlling unit 13 determines that the chuck voltage has reached the set voltage ("Yes" in step S207), the charged-particle-beam apparatus 1 performs the observing operation (length measurement) while applying the higher voltage to the chuck electrode 26 in step S209.

In actual operation, control is performed according to measurement-parameter settings, based on the flow chart shown in FIG. 8.

In addition, in the case that the sample holding time becomes as many as several tens of hours like the evaluation measurement of the wafer 24, since there is a risk of occurrence of the residual clamping, the higher voltage is applied to the chuck electrode 26 only when the edge portion of the wafer 24 is the observation target. In other times, that is, when a portion other than the edge portion of the wafer 24 is the observation target, a lower voltage is applied to the chuck electrode 26.

In contrast, in the case that the sample holding time is short like the measurement of a mass production of the wafer 24, the voltage applied to the chuck electrode 26 may be set to a higher voltage during the observation point is being moved to the edge portion of the wafer 24 because a priority is placed on the throughput, and thereafter the higher voltage may be kept regardless of the position of the sample stage 25. Since the applied voltage to the chuck electrode 26 is several hundred volts even when a low voltage is applied, the time required for the voltage to stabilize in the voltage changes from the higher voltage to the lower voltage cannot be ignored. Therefore, in the measurement environment in which the sample holding time is short, keeping the voltage applied to the chuck electrode 26 unchanged to the utmost may enable preventing throughput degradation.

Further, in the case of measurement of the flat wafer, it is allowable to conduct a first intensive measurement at the central portion of the wafer 24 where the lower voltage is applied to the chuck electrode 26, then to conduct another intensive measurement at the edge portion of the wafer 24 where the higher voltage is required.

This suppresses the number of the applied voltage change to only once and to reduce the time to apply the higher voltage, leading to reduction of the influence of the residual-clamping force and prevention of the throughput degradation.

The present exemplary embodiment enables increasing the visual field of the sample image.

In addition, the present embodiment enables improving accuracy of the observation region of the sample.

Modified Example

One exemplary embodiment according to the present invention is described above, but the present invention is not limited thereto and can be modified to the extent that the embodiment does not depart away from the subject matter of the present invention.

For example, the present invention is not limited to the charged-particle-beam apparatus described in the above embodiment, and can be widely applied for clamping a sample or the like using the electrostatic chuck.

Further, in the exemplary embodiment of the present invention, the steps of the flowchart are performed serially in time along the described order, however, the sequential processing is not essential, but the present invention also includes processing to be executed in parallel or individually.

Furthermore, appropriate combinations of the multiple components disclosed in the above embodiment can form various inventions. For example, some of all components shown in the embodiment may be deleted. Further, the components in different embodiments may be appropriately combined.

DESCRIPTION OF REFERENCE NUMERALS

1 Charged particle beam apparatus
12 Sample-stage controlling unit
13 Electrostatic-chuck controlling unit
16 Primary electron beam
24 Wafer (sample)
25 Sample stage
26 Chuck electrode
30 Electrostatic chuck
51 Initial voltage
52 Applied voltage
53, 54 Transient current indicating the normal clamping of the wafer
131 Voltage applying unit
132 Current detection unit
133 Clamping determining unit
134 Output-voltage dividing and monitoring unit

What is claimed is:

1. A charged-particle-beam apparatus for generating an image of a sample by irradiating the sample held on a sample stage by an electrostatic chuck with an electron beam, the apparatus comprising:

an electrostatic-chuck controlling unit, to hold the sample;
applying a preset initial voltage to a chuck electrode of the electrostatic chuck;
determining whether or not a transient current generated from the chuck electrode equals to or is greater than a predetermined threshold; and
if it is determined that the transient current generated is not equal to or greater than the predetermined threshold, increasing the voltage applied to the chuck electrode until the transient current generated equals to or is greater than the predetermine threshold.

2. An electrostatic-chuck apparatus including an electrostatic-chuck for clamping a sample, the apparatus comprising:

an electrostatic-chuck controlling unit, to hold the sample;
applying a preset initial voltage to a chuck electrode of the electrostatic chuck;
determining whether or not a transient current generated from the chuck electrode equals to or is greater than a predetermined threshold; and
if it is determined that the transient current generated is not equal to or greater than the predetermined threshold, increasing the voltage applied to the chuck electrode until the transient current generated equals to or is greater than the predetermined threshold.

* * * * *